US010364614B2

(12) United States Patent
Voronin et al.

(10) Patent No.: US 10,364,614 B2
(45) Date of Patent: Jul. 30, 2019

(54) POLYCRYSTALLINE ULTRA-HARD CONSTRUCTIONS WITH MULTIPLE SUPPORT MEMBERS (71) Applicant: Smith International, Inc., Houston, TX (US)

(72) Inventors: Georgiy Voronin, Orem, UT (US); J. Daniel Belnap, Lindon, UT (US)

(73) Assignee: Smith International, Inc., Houston, TX (US)

(*) Notice: Subject to any disclaimer, the term of this patent is extended or adjusted under 35 U.S.C. 154(b) by 377 days.

(21) Appl. No.: 14/822,454

(22) Filed: Aug. 10, 2015

(65) Prior Publication Data
US 2015/0343599 A1 Dec. 3, 2015

Related U.S. Application Data (62) Division of application No. 11/971,896, filed on Jan. 9, 2008, now Pat. No. 9,217,296.

(51) Int. Cl.
B24D 3/00 (2006.01)
B24D 3/10 (2006.01)
(Continued)

(52) U.S. Cl.
CPC ............ *E21B 10/573* (2013.01); *B24D 3/001* (2013.01); *B24D 3/10* (2013.01); *C22C 1/002* (2013.01);
(Continued)

(58) Field of Classification Search
CPC .. E21B 10/573; E21B 10/5735; E21B 10/567; E21B 10/5676; B24D 3/001; B24D 3/10; C22C 1/002
See application file for complete search history.

(56) References Cited

U.S. PATENT DOCUMENTS 3,609,818 A 10/1971 Wentorf
3,745,623 A 7/1973 Rocco et al.
(Continued)

FOREIGN PATENT DOCUMENTS

CA 2154055 C 4/2001
CA 2489709 A1 6/2005
(Continued)

OTHER PUBLICATIONS

Mizuhara et al., "High-reliability Joining of Ceramic to Metal", Ceramic Bulletin, vol. 68, No. 9, 1989, pp. 1591-1599.
(Continued)

*Primary Examiner* — Nicole Coy (57) ABSTRACT

Polycrystalline ultra-hard constructions comprise a polycrystalline ultra-hard material body and two or more support members attached to the body by braze material. The support members include a backside support member and a side support member. The side support member is a one- or two-piece construction, and is positioned circumferentially around and extends axially along the body or both the body and the backside support member such that a working surface of the body remains exposed. The support members can be configured to provide a mechanical attachment or interlocking attachment with the body or another support member. The braze materials used in the construction can be different and selected to enhance the attachment and/or reduce the creation of thermal stress within the construction during assembly. The support members can be selected having different thermal expansion characteristics that also operate to reduce the thermal stress during construction assembly.

23 Claims, 7 Drawing Sheets (51) Int. Cl.
  *C22C 1/00* (2006.01)
  *E21B 10/567* (2006.01)
  *E21B 10/573* (2006.01)
  *C09G 1/02* (2006.01)
  *C09K 3/14* (2006.01)
  *H01L 21/321* (2006.01)

(52) U.S. Cl.
  CPC ........ *E21B 10/567* (2013.01); *E21B 10/5676* (2013.01); *E21B 10/5735* (2013.01); *B22F 2998/00* (2013.01); *C09G 1/02* (2013.01); *C09K 3/1409* (2013.01); *C22C 2204/00* (2013.01); *H01L 21/3212* (2013.01)

(56) References Cited

U.S. PATENT DOCUMENTS

| | | |
|---|---|---|
| 3,850,591 A | 11/1974 | Wentorf |
| 4,156,329 A | 5/1979 | Daniels et al. |
| 4,186,628 A | 2/1980 | Bonnice |
| 4,199,035 A | 4/1980 | Thompson |
| 4,200,159 A | 4/1980 | Peschel et al. |
| 4,224,380 A | 9/1980 | Bovenkerk et al. |
| 4,394,170 A | 7/1983 | Sawaoka et al. |
| 4,403,015 A | 9/1983 | Nakai et al. |
| 4,629,373 A | 12/1986 | Hall et al. |
| 4,647,546 A | 3/1987 | Hall et al. |
| 4,673,044 A | 6/1987 | Bigelow et al. |
| 4,729,440 A | 3/1988 | Hall |
| 4,797,241 A | 1/1989 | Peterson et al. |
| 4,850,523 A | 7/1989 | Slutz |
| 4,899,922 A | 2/1990 | Slutz et al. |
| 4,954,139 A | 9/1990 | Cerutti |
| 5,012,863 A | 5/1991 | Springer |
| 5,049,164 A | 9/1991 | Horton et al. |
| 5,159,857 A | 11/1992 | Jurewicz |
| 5,333,699 A | 8/1994 | Thigpen et al. |
| 5,352,542 A | 10/1994 | Voelcker et al. |
| 5,373,908 A | 12/1994 | Pastusek |
| 5,429,199 A | 7/1995 | Sheirer et al. |
| 5,435,403 A | 7/1995 | Tibbitts |
| 5,487,436 A | 1/1996 | Griffin |
| 5,533,582 A | 7/1996 | Tibbitts |
| 5,560,440 A | 10/1996 | Tibbitts |
| 5,737,980 A | 4/1998 | Keith et al. |
| 5,967,249 A | 10/1999 | Butcher |
| 6,054,693 A | 4/2000 | Barmatz et al. |
| 6,213,380 B1 | 4/2001 | Collins et al. |
| 6,439,327 B1 | 8/2002 | Griffin et al. |
| 6,541,124 B1 | 4/2003 | Suggs |
| 6,742,611 B1 | 6/2004 | Illerhous et al. |
| 7,320,505 B1 | 1/2008 | Hall et al. |
| 7,347,292 B1 | 3/2008 | Hall et al. |
| 7,389,834 B1 | 6/2008 | Kembaiyan |
| 7,487,849 B2 | 2/2009 | Radtke |
| 7,597,159 B2 | 10/2009 | Overstreet |
| 7,625,521 B2 | 12/2009 | Izaguirre et al. |
| 7,703,555 B2 | 4/2010 | Overstreet |
| 7,757,793 B2 | 7/2010 | Voronin |
| 7,997,358 B2 | 8/2011 | Izaguirre et al. |
| 7,997,359 B2 | 8/2011 | Eason et al. |
| 8,002,052 B2 | 8/2011 | Stevens et al. |
| 2003/0079916 A1 | 5/2003 | Oldham |
| 2003/0084894 A1 | 5/2003 | Sung |
| 2004/0244540 A1 | 12/2004 | Oldham et al. |
| 2004/0245022 A1 | 12/2004 | Izaguirre et al. |
| 2005/0087371 A1 | 4/2005 | Kembaiyan |
| 2005/0089440 A1 | 4/2005 | Kembaiyan |
| 2005/0103533 A1 | 5/2005 | Sherwood, Jr. et al. |
| 2005/0230156 A1 | 10/2005 | Belnap et al. |
| 2005/0263328 A1 | 12/2005 | Middlemiss |
| 2006/0191723 A1 | 8/2006 | Keshavan |
| 2006/0207802 A1 | 9/2006 | Zhang et al. |
| 2006/0254830 A1 | 11/2006 | Radtke |
| 2007/0023206 A1 | 2/2007 | Keshavan et al. |
| 2007/0056776 A1 | 3/2007 | Overstreet |
| 2007/0079994 A1 | 4/2007 | Middlemiss |
| 2007/0102199 A1 | 5/2007 | Smith et al. |
| 2007/0131459 A1 | 6/2007 | Voronin et al. |
| 2007/0205023 A1 | 9/2007 | Hoffmaster |
| 2007/0278017 A1 | 12/2007 | Shen et al. |
| 2008/0029310 A1 | 2/2008 | John |
| 2008/0128176 A1 | 6/2008 | Choe |
| 2008/0164070 A1 | 7/2008 | Keshavan |
| 2008/0230279 A1 | 9/2008 | Bitler |
| 2009/0102588 A1 | 4/2009 | Sigler et al. |
| 2009/0173014 A1 | 7/2009 | Voronin et al. |
| 2009/0173547 A1 | 7/2009 | Voronin |
| 2009/0173548 A1 | 7/2009 | Voronin |
| 2010/0187020 A1 | 7/2010 | Zhang |
| 2010/0264198 A1 | 10/2010 | Voronin |
| 2010/0314176 A1 | 12/2010 | Zhang et al. |
| 2011/0024200 A1 | 2/2011 | Digiovanni et al. |
| 2011/0031031 A1 | 2/2011 | Vempati et al. |

FOREIGN PATENT DOCUMENTS

| | | |
|---|---|---|
| CA | 2588331 A1 | 11/2007 |
| EP | 0295151 A2 | 12/1988 |
| FR | 2774420 A1 | 8/1999 |
| GB | 2163144 A | 2/1986 |
| GB | 2337063 A | 11/1999 |
| GB | 2351987 A | 1/2001 |
| GB | 2422394 A | 7/2006 |
| GB | 2427215 A | 12/2006 |
| GB | 2431948 A | 5/2007 |
| GB | 2471412 B | 2/2011 |
| GB | 2471413 B | 2/2011 |
| JP | 2000000686 A | 1/2000 |
| SU | 1803518 A1 | 3/1993 |
| WO | 9845091 A2 | 10/1998 |
| WO | 199929465 A1 | 6/1999 |

OTHER PUBLICATIONS

Examiners report issued in Canadian patent application 2646752 dated Mar. 12, 2015, 3 pages.
Search Report for British Patent Application GB0900060.5 dated Apr. 9, 2009, 3 pages.
Examination Report dated Nov. 23, 2009 for Irish Application No. 2008/1014, 1 page.
Office Action issued in U.S. Appl. No. 11/971,891 dated Mar. 4, 2010, 13 pages.
Office Action issued in U.S. Appl. No. 11/971,891 dated Sep. 2, 2010, 12 pages.
Office Action issued in U.S. Appl. No. 11/971,891 dated Feb. 3, 2011, 13 pages.
Notice of Allowance issued in U.S. Appl. No. 11/971,891 dated Jul. 18, 2011, 7 pages.
Examination Report issued in Canadian patent application 2646370 dated Mar. 12, 2015, 3 pages.
Search Report for British Patent Application GB0900059.7 dated Mar. 18, 2009, 3 pages.
Examination Report issued in GB application No. GB0900059.7 dated Sep. 1, 2011, 3 pages.
Official Letter dated Nov. 2, 2009 from Irish Patent Office regarding Irish application No. 2008/1012, 1 page.
Examination Report of Canadian Application Appl. Serial No. 2,567,011 dated Jan. 24, 2012, pp. 1-2.
Examination Report of Canadian Application U.S. Application No. 2,567,011 dated Sep. 14, 2012: pp. 1-3.
Examination Report of Canadian Application Serial No. 2,567,011 dated May 17, 2013, pp. 1-2.
Examination Report of Canadian Application No. 2,567,011 dated Dec. 16, 2013, 2 pages.
Search Report dated Feb. 21, 2007 for British patent application No. GB0621679.0, 3 pages.
Examination Report dated Feb. 25, 2010 for British patent application No. GB0621679.0, 2 pages.

(56) References Cited

OTHER PUBLICATIONS

Examination Report dated Jul. 28, 2010 in British patent application GB0621679.0, 1 page.
Combined Search and Examination Report issued in GB1016297.2 dated Oct. 25, 2010, 10 pages.
Combined Search and Examination Report issued in GB1016299.8 dated Oct. 25 2010; 10 pages.
Office Action dated Mar. 30, 2009 in related U.S. Appl. No. 11/554,896, 9 pages.
Office Action dated Sep. 24, 2009 issued in U.S. Appl. No. 11/554,896, 9 pages.
Examiner Interview Summary dated Mar. 11, 2010 in U.S. Appl. No. 11/554,896, 2 pages.
Notice of Allowance dated Mar. 11, 2010 in U.S. Appl. No. 11/554,896, 9 pages.
Office Action dated Feb. 3, 2011 for U.S. Appl. No. 12/826,290, 13 pages.
Office Action dated Jun. 24, 2011 for U.S. Appl. No. 12/826,290, 17 pages.
Office Action dated Sep. 23, 2011 for U.S. Appl. No. 12/826,290, 15 pages.
Office Action dated Apr. 12, 2012 for U.S. Appl. No. 12/826,290, 18 pages.
Office Action dated Jan. 9, 2013 for related U.S. Appl. No. 12/826,290, 15 pages.
Office Action dated Jun. 12, 2013 for related U.S. Appl. No. 12/826,290, 18 pages.
Notice of Allowance dated Feb. 4, 2014 in U.S. Appl. No. 12/826,290, 5 pages.
Examination Report issued in Canadian patent application 2646374, dated Mar. 12, 2015, 4 pages.
Search Report dated Apr. 8, 2009 for British patent application No. GB0900061.3, 4 pages.
Amendment to Search report dated Aug. 5, 2009 for British patent application No. GB0900061.3, 4 pages.
Examination Report issued in UK Patent Application GB0900061.3, dated Nov. 29, 2011, 2 pages.
Combined Search and Examination Report issued in British patent application GB1201558.2, dated Mar. 5, 2012, 5 pages.
Office Action dated Nov. 13, 2009 in U.S. Appl. No. 11/971,893, 16 pages.
Office Action dated Apr. 29, 2010 for U.S. Appl. No. 11/971,893, 13 pages.
Notice of Allowance dated Nov. 10, 2010 for U.S. Appl. No. 11/971,893, 6 pages.
Office Action dated May 19, 2011, issued in U.S. Appl. No. 13/024,747, 12 pages.
Office Action dated Nov. 2, 2011, in U.S. Appl. No. 13/024,747, 10 pages.
Office Action dated Apr. 24, 2012 for U.S. Appl. No. 13/024,747, 11 pages.
Office Action dated Oct. 19, 2012 for U.S. Appl. No. 13/024,747, 10 pages.
Office Action dated Mar. 25, 2013 issued in U.S. Appl. No. 13/024,747, 9 pages.
Notice of Allowance dated Oct. 28, 2013 in U.S. Appl. No. 13/024,747, 7 pages.
Examination Report issued in UK Patent Application GB1113332.9, dated Jan. 2, 2013, 3 pages.
Examination Report issued in UK Patent Application GB1113332.9, dated Mar. 15, 2013, 2 pages.
International Search Report and Written Opinion issued in International Patent Application PCT/US2010/022565, dated Jun. 18, 2010, 16 pages.
International Preliminary Report on Patentability issued in International patent application PCT/US2010/022565, dated Aug. 2, 2011, 6 pages.
Office Action issued in U.S. Appl. No. 12/696,706, dated Jan. 31, 2012, 8 pages.
Notice of Allowance dated Sep. 24, 2012 in U.S. Appl. No. 12/696,706, 5 pages.

POLYCRYSTALLINE ULTRA-HARD CONSTRUCTIONS WITH MULTIPLE SUPPORT MEMBERS

CROSS-REFERENCE TO RELATED APPLICATIONS

This application is a divisional of U.S. patent application Ser. No. 11/971,896, filed on Jan. 9, 2008, the contents of which are incorporated by reference.

FIELD OF THE INVENTION

This invention generally relates to polycrystalline ultra-hard constructions and, more particularly, to polycrystalline diamond constructions specially engineered comprising a number of support members that are specially configured and attached thereto to provide improved bond strength and reduced residual thermal stress to the resulting construction when compared to conventional polycrystalline ultra-hard compacts.

BACKGROUND OF THE INVENTION

Polycrystalline ultra-hard constructions, such as polycrystalline diamond (PCD) materials and PCD elements formed therefrom, are well known in the art. Conventional PCD is formed by subjecting diamond grains to processing conditions of extremely high pressure and high temperature in the presence of a suitable solvent catalyst material, wherein the solvent catalyst material promotes desired intercrystalline diamond-to-diamond bonding between the grains, thereby forming a PCD structure. The solvent catalyst material can be combined with the diamond grains prior to processing or the solvent catalyst material can be provided from an outside source, e.g., from an adjacent substrate body or the like that contains the solvent catalyst material, by infiltration during processing. The resulting PCD structure produces enhanced properties of wear resistance and hardness, making PCD materials extremely useful in aggressive wear and cutting applications where high levels of wear resistance and hardness are desired.

Solvent catalyst materials typically used for forming conventional PCD include metals selected from Group VIII of the Periodic table, with cobalt (Co) being the most common. Conventional PCD can comprise from 85 to 95% by volume diamond and a remaining amount of the solvent catalyst material. The solvent catalyst material is disposed within interstitial regions of the PCD microstructure that exist between the bonded together diamond grains or crystals.

A problem known to exist with such conventional PCD materials is thermal degradation due to differential thermal expansion characteristics between the interstitial solvent catalyst material and the bonded together diamond crystals. Such differential thermal expansion is known to occur at temperatures starting at about 400° C., causing ruptures to occur in the diamond-to-diamond bonding, and resulting in the formation of cracks and chips in the PCD structure.

Another problem known to exist with conventional PCD materials also relates to the presence of the solvent catalyst material in the interstitial regions of the microstructure and the adherence of the solvent catalyst to the diamond crystals that is known to cause another form of thermal degradation. Specifically, the solvent catalyst material is known to cause an undesired catalyzed phase transformation in diamond (converting it to carbon monoxide, carbon dioxide, or graphite) with increasing temperature, thereby limiting practical use of such PCD materials to about 750° C.

Attempts at addressing such unwanted forms of thermal degradation in PCD are known in the art. Generally, these attempts have involved treating the PCD to remove the solvent catalyst material therefrom. PCD materials that have been treated in this manner are referred to as being thermally stable. Such thermally stable polycrystalline diamond (TSP) materials have a material microstructure comprising a polycrystalline matrix phase of bonded together diamond crystals, and a remaining phase comprising a plurality of pores or voids interposed between the diamond crystals resulting from the removal of the solvent catalyst material.

Such TSP material formed from PCD typically does not include a metallic substrate attached thereto, as any metal substrate is either removed from the PCD before treatment, or if not removed beforehand, falls away from the PCD body after treatment by the removal of the solvent metal catalyst at the interface previously joining the PCD body to the substrate.

A problem known to exist with using such TSP materials in conjunction with known cutting and/or wear devices such as subterranean drill bits or the like is the need to attach the TSP material to a substrate to provide an overall construction that permits attachment with a desired cutting or wear device by conventional technique, such as by welding, brazing or the like. However, such TSP materials typically have a poor wetablity and have a coefficient of thermal expansion that is significantly different from that of substrate materials conventionally used for attaching polycrystalline bodies thereto, thereby making it very difficult to bond the TSP material to such conventionally used substrates.

Attempts have been made to form compact constructions from TSP material by brazing the TSP body to a desired substrate. However, such compact constructions comprising the TSP material brazed together with a substrate, e.g., formed from cemented tungsten carbide, are known to be easily fractured along the braze joint, which fracture is believed to be caused by the formation of voids and residual thermal stresses in the braze joint during the process of brazing. Thus, compacts formed by brazing such TSP material to such conventional types of substrates are known to be vulnerable to fatigue and/or impact damage at the interface when placed into a wear and/or cutting operation. Accordingly, conventional TSP compacts formed in this manner typically have a reduced service life that is not desired in most cutting and/or wear applications.

An alternative approach for using conventional TSP materials in wear and/or cutting application has been to avoid the use of a substrate completely, and rather attach the TSP material or body directly to the intended cutting and/or wear device, i.e., without the use of an intervening substrate. However, because such TSP materials lack either a metallic material or a metallic substrate, they cannot (e.g., when configured as a cutting element for use in a subterranean drill bit) be attached to a drill bit by conventional brazing process. Thus, use of such TSP materials in this particular application necessitates that the TSP material or body itself be mounted to the drill bit by mechanical or interference fit during manufacturing of the drill bit, which is labor intensive, time consuming, and which does not provide a most secure method of attachment.

It is, therefore, desired that polycrystalline ultra-hard constructions be provided in the form of a compact including a polycrystalline ultra-hard material having a desired degree of thermal stability, and that is attached to a substrate. It is desired that such construction have properties of improved bond strength when compared to the above-noted conventional TSP constructions. It is also desired that such polycrystalline ultra-hard constructions be provided in a manner that display reduced residual thermal stress when compared to conventional TSP compact constructions. It is further desired that polycrystalline ultra-hard constructions be provided comprising a support structure that is specially designed to enhance the strength of the construction and/or that provides reduced residual thermal stress, and/or that provides an improved attachment with the cutting and/or wear device, when compared to conventional TSP compact constructions lacking such support structure.

SUMMARY OF THE INVENTION

Polycrystalline ultra-hard constructions of this invention comprise a polycrystalline ultra-hard material body, and two or more support members that are attached to a surface of the body by a braze material. In an example embodiment, the body is formed from TSP. The support members can include a backside support member that is attached to a backside surface of the body, and a side support member that is also attached to the body.

The side support member can be provided in the form of a one- or two-piece construction and is positioned circumferentially around at least a portion of the body. In one example embodiment, the side support is disposed circumferentially around both the body and the backside support member, and in another example embodiment the side support is disposed circumferentially around only the body. The side support member thus extends in one embodiment a distance axially along the body, and in another embodiment a distance along the body and the backside support member. In a preferred embodiment, the side support is configured such that a working surface of the body remains exposed and uncovered.

One or more of the support members can be configured having an interface surface with surface features that are engineered to provide a mechanical attachment with the body or another support member. In an example embodiment, the side support member can include an interface surface that complements an interface surface with the backside support member to provide a mechanical attachment therebetween. In another example embodiment, when the side support is provided as a two-piece assembly, each such piece may have complementary interfacing surfaces that provide a mechanical attachment therebetween. The mechanical attachment can be an interlocking attachment.

The braze materials that are used to attach the body to the support members, and/or to attach the support members together can be different and can be selected to provide an enhanced attachment between the body and the support members, and also to provide desired melting and cooling temperatures to reduce the creation of thermal stress within the construction during the assembly process. Additionally, the choices of materials selected to form the support members may also be selected to having certain thermal expansion characteristics that also operate to control or reduce the thermal stresses that can be created within the construction during construction.

BRIEF DESCRIPTION OF THE DRAWINGS

These and other features and advantages of the present invention will be appreciated as the same becomes better understood by reference to the following detailed description when considered in connection with the accompanying drawings wherein.

DETAILED DESCRIPTION

Polycrystalline ultra-hard constructions of this invention comprise a polycrystalline ultra-hard material body having desired thermally stable properties, e.g., that can be formed from a TSP material, and are specifically engineered having multiple support members that are attached thereto by one or more braze materials to thereby provide a polycrystalline ultra-hard construction that can be readily attached to a tooling, cutting and/or wear device, e.g., to a bit used for drilling subterranean earthen formations when the construction is provided in the form of a cutting element, by conventional means such as by brazing and the like. In an example embodiment, the polycrystalline ultra-hard material comprises bonded-together diamond grains or crystals. In certain embodiments, the entire material or body may be substantially free of a catalyst material used to form the body, a portion of the body may be substantially free of a catalyst material used to form the body, or the body may wholly retain the catalyst material.

Polycrystalline ultra-hard constructions of this invention are specially designed to provide properties of improved bond strength and reduced residual thermal stress when compared to conventional TSP materials or compacts formed therefrom that do not include the multiple support members, thereby providing improved service life when placed into wear and/or cutting applications.

As used herein, the term "PCD" is understood to refer to polycrystalline diamond that has been formed, at high pressure-high temperature (HPHT) conditions, through the use of a catalyst material, such as those metal solvent catalysts included in Group VIII of the Periodic table. PCD comprises a polycrystalline phase of bonded-together diamond crystals, and catalyst material that is disposed in interstitial regions between the diamond crystals.

As used herein, the term "TSP" is understood to refer to a thermally stable polycrystalline material having a microstructure characterized by: 1) a polycrystalline phase comprising bonded-together ultra-hard particles and a plurality of voids or pores in the polycrystalline phase; or 2) a polycrystalline phase comprising ultra-hard particles and a second phase of non-solvent catalyst material mixed with ultra-hard particles. The non-solvent catalyst material can be in the form of a reaction product with the ultra-hard material after HPHT processing. In an example embodiment, the reaction product can be formed by reacting a non-solvent catalyst material known to form a relatively thermally stable compound with the polycrystalline phase Polycrystalline ultra-hard materials useful for making constructions of this invention can include those polycrystalline ultra-hard materials that have a desired degree of thermal stability to facilitate use in high temperature wear and/or cutting applications. Examples of such polycrystalline ultra-hard materials include but are not limited to TSP, polycrystalline cubic boron nitride (PcBN), mixtures thereof and the like. In an example embodiment, constructions of this invention are formed by using TSP as the polycrystalline ultra-hard material.

The polycrystalline phase for the polycrystalline ultra-hard material can be selected from materials in the group including diamond, cubic boron nitride (cBN), and mixtures thereof. When the polycrystalline phase comprises bonded-together diamond crystals, and the body further comprises a plurality of voids or empty pores, the voids or pores are formed by removing a solvent catalyst material that was used to facilitate diamond bonding during formation of the polycrystalline phase.

Figure 1:
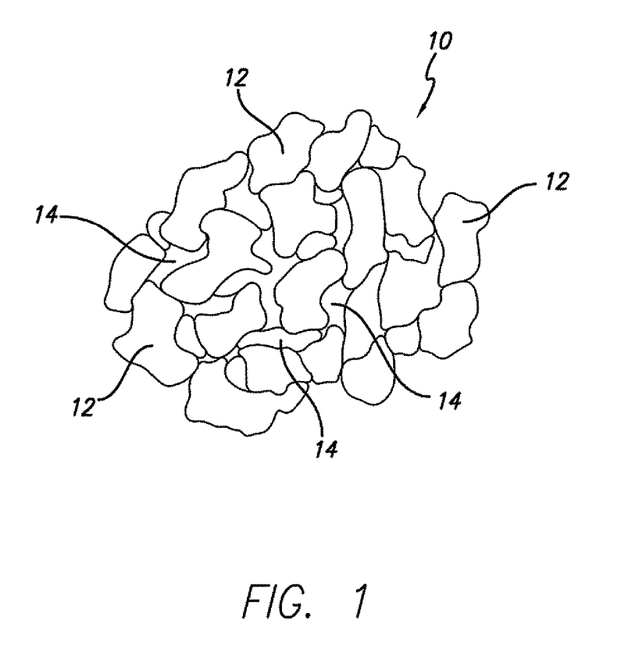
FIG. 1 is schematic view taken from a region of a thermally stable polycrystalline ultra-hard material.

FIG. 1 illustrates a region of a TSP material 10 used for forming constructions of this invention. The TSP material includes a polycrystalline material phase 12 and a plurality of voids or pores 14 within the polycrystalline phase. In an example embodiment, the polycrystalline phase 12 comprises intercrystalline bonded diamond that is formed by bonding together adjacent diamond grains or crystals at HPHT conditions. The bonding together of the diamond grains at HPHT is facilitated by the use of an appropriate catalyst material. In an example embodiment, the catalyst material is a metal solvent catalyst. In such example embodiment, the plurality of voids or pores 14 is disposed interstitially between the bonded together diamond grains.

Diamond grains useful for forming polycrystalline ultra-hard constructions of this invention include natural and/or synthetic diamond powders having an average diameter grain size in the range of from submicrometer in size to 100 micrometers, and more preferably in the range of from about 1 to 80 micrometers. The diamond powder can contain grains having a mono or multi-modal size distribution. In an example embodiment, the diamond powder has an average particle grain size of approximately 20 micrometers. In the event that diamond powders are used having differently sized grains, the diamond grains are mixed together by conventional process, such as by ball or attritor milling for as much time as necessary to ensure good uniform distribution.

The diamond grain powder is preferably cleaned, to enhance the sinterability of the powder by treatment at high temperature, in a vacuum or reducing atmosphere. The diamond powder mixture is loaded into a desired container for placement within a suitable HPHT consolidation and sintering device.

The diamond powder may be combined with a desired catalyst material, e.g., a solvent metal catalyst, in the form of a powder to facilitate diamond bonding during the HPHT process and/or the catalyst material can be provided by infiltration from a substrate positioned adjacent the diamond powder and that includes the catalyst material. Suitable catalyst materials include metal solvent catalysts such as those selected from Group VIII elements of the Periodic table that are conventionally used to form PCD. A particularly preferred metal solvent catalyst is cobalt (Co).

Suitable substrates useful for as a source for infiltrating the catalyst material can include those used to form conventional PCD materials, including carbides, nitrides, carbonitrides, ceramic materials, metallic materials, cermet materials, and mixtures thereof. A feature of such substrate is that it includes a metal solvent catalyst that is capable of melting and infiltrating into the adjacent volume of diamond powder to facilitate the formation of diamond-to-diamond intercrystalline bonding during the HPHT process. As noted above, suitable metal solvent catalyst materials include those selected from Group VIII elements of the Periodic table. A particularly preferred metal solvent catalyst is cobalt (Co), and a preferred substrate material is cemented tungsten carbide (WC—Co).

Alternatively, the diamond powder mixture can be provided in the form of a green-state part or mixture comprising diamond powder that is combined with a binding agent to provide a conformable material product, e.g., in the form of diamond tape or other formable/conformable diamond mixture product to facilitate the manufacturing process. In the event that the diamond powder is provided in the form of such a green-state part, it is desirable that a preheating step take place before HPHT consolidation and sintering to drive off the binder material. In an example embodiment, the PCD material resulting from the above-described HPHT process may have diamond volume content in the range of from about 85 to 95 percent.

The diamond powder mixture or green-state part is loaded into a desired container for placement within a suitable HPHT consolidation and sintering device. The HPHT device is activated to subject the container to a desired HPHT condition to effect consolidation and sintering of the diamond powder. In an example embodiment, the device is controlled so that the container is subjected to a HPHT process having a pressure of approximately 5,500 MPa and a temperature of from about 1,350° C. to 1,500° C. for a predetermined period of time. At this pressure and temperature, the solvent metal catalyst melts and infiltrates into the diamond powder mixture, thereby sintering the diamond grains to form PCD.

While a particular pressure and temperature range for this HPHT process has been provided, it is to be understood that such processing conditions can and will vary depending on such factors as the type and/or amount of metal solvent catalyst used, as well as the type and/or amount of diamond powder used to form the PCD region. After the HPHT process is completed, the container is removed from the HPHT device, and the so-formed PCD material is removed from the container.

In the event that a substrate is used during the HPHT process, e.g., as a source of the catalyst material, such substrate may be removed prior to treating the PCD material to remove the catalyst material therefrom to form the TSP material. Alternatively, the substrate can remain attached. Removing the substrate at this stage is desired for the purpose of expediting the process of removing the catalyst material from the PCD body.

The term "removed", as used with reference to the catalyst material after the treatment process for forming TSP, is understood to mean that a substantial portion of the catalyst material no longer resides within the polycrystalline ultra-hard material. However, it is to be understood that some small amount of catalyst material may still remain in the microstructure of the TSP material, e.g., within the interstitial regions and/or adhered to the surface of the diamond crystals. Under some thermodynamic circumstances, some small amount of catalyst material may react with other compounds present in the material during sintering. In such circumstances, both the catalytic function and the ability of a post-sintering operation to remove this reacted compound are greatly compromised. Accordingly, such small amount of the catalyst material may reside within the polycrystalline matrix material after the treatment process. Additionally, the term "substantially free", as used herein to refer to the catalyst material in the TSP material after the treatment process, is understood to mean that there may still be some small/trace amount of catalyst material remaining within the TSP material as noted above.

In an example embodiment of the invention where formation of a TSP material is desired, the PCD material is treated to render the entire body substantially free of the catalyst material. This can be done, for example, by removing substantially all of the catalyst material therefrom by suitable process. Example processes useful for removing the second phase material include chemical treatment such as by acid leaching or aqua regia bath, electrochemically such as by electrolytic process, by liquid metal solubility, or by liquid metal infiltration that sweeps the existing catalyst material away and replaces it with another noncatalyst material during a liquid phase sintering process, or by combinations thereof. In an example embodiment, the catalyst material is removed from the PCD material by an acid leaching technique, such as that disclosed for example in U.S. Pat. No. 4,224,380.

Alternatively, TSP materials useful for forming constructions of this invention may be formed such that they have a material microstructure comprising a polycrystalline phase and a second phase that is a reaction product of the polycrystalline phase and another material, e.g., a non-solvent catalyst material. Since this type of TSP material does not include a metal solvent catalyst, there is no need for subsequent treating as described above. As used herein, the term "solvent catalyst" is understood to refer to those types of materials typically used to form PCD during HPHT conditions, and/or that can operate to cause an unwanted change in the nature of the polycrystalline material during operation of the construction in a wear and/or cutting operation. For example, when the polycrystalline ultra-hard material is polycrystalline diamond, it is desired that the non-solvent catalyst be a material that does not cause graphitization of the polycrystalline diamond during operating temperatures.

Example materials useful for forming the non-solvent catalyst in such TSP material embodiment include those materials capable of reacting with the polycrystalline phase material to form a compound that can bond together with the polycrystalline phase material. In an example embodiment, wherein the polycrystalline phase material is polycrystalline diamond, the non-solvent catalyst is silicon (Si) that reacts with the carbon in the polycrystalline diamond to form silicon carbide (SiC).

As an alternative to rendering the entire polycrystalline ultra-hard material body substantially free of the catalyst material, the polycrystalline ultra-hard material resulting from the HPHT process, e.g., PCD when the ultra-hard material is diamond grains or crystals, may be treated such that the catalyst material is removed only from a select region or volume of the body. In such example, the resulting polycrystalline ultra-hard material body can be one that includes one region that is substantially free of the catalyst material, and another region that includes the catalyst material. In such alternative embodiment, the catalyst material can be removed by the same methods as noted above, but controlled to remove the catalyst material in only the targeted region.

In an example embodiment, all or part of the region substantially free of the catalyst material can be positioned at a cutting and/or working surface of the body to take advantage of the improved thermal stability provided by removal of the catalyst material. Generally speaking, polycrystalline ultra-hard constructions of this invention comprise a body formed from a polycrystalline ultra-hard material as described above, that is attached to two or more support members by the use of one or more braze materials. The configurations of the support members, the materials used to form the support members, and the types of braze materials that are used to attach the body to the support members and/or to attach the support members to one another are specifically selected to provide a polycrystalline ultra-hard construction having improved mechanical bond strength and reduced residual thermal stress when compared to conventional polycrystalline ultra-hard compact constructions lacking the use of such support members.

Figures 2A, 2B, 2E:
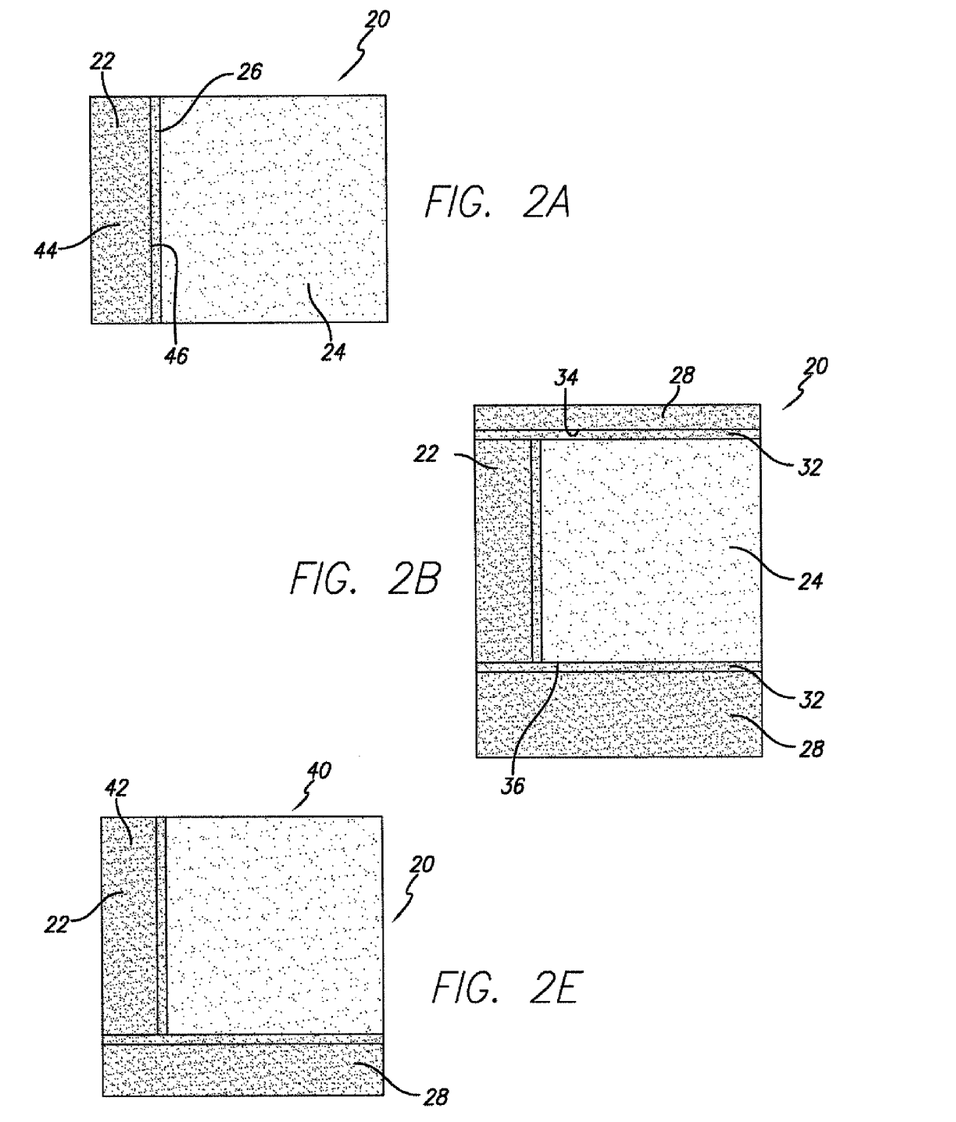
FIGS. 2A to 2F are cross-sectional side and front plan views of an example embodiment polycrystalline ultra-hard construction of this invention comprising backside and side support members, wherein the side support members are disposed around at least a portion of both the polycrystalline ultra-hard material and the backside support member.

FIGS. 2A to 2F illustrate example embodiment polycrystalline ultra-hard constructions 20 of this invention at different stages of completion. FIG. 2A illustrates the construction 20 at an early stage of formation when it comprises a polycrystalline ultra-hard material 22 having a backside support member 24 attached thereto. In an example embodiment, the polycrystalline ultra-hard material is provided in the form of a TSP body, and the body is attached to the backside support member 24 by brazing technique using a suitable braze material 26.

Figure 2C:
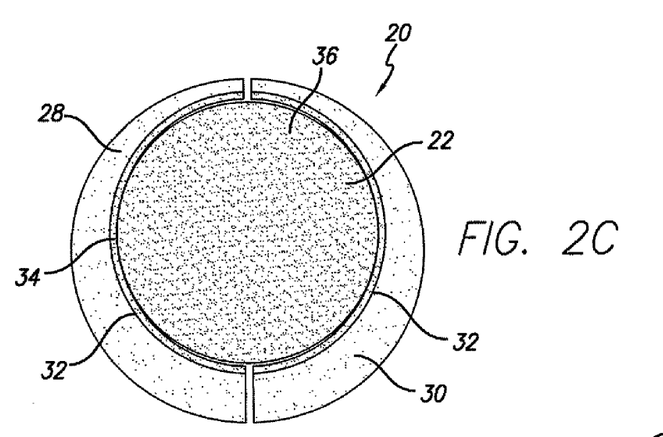
Figures 2D, 2F:
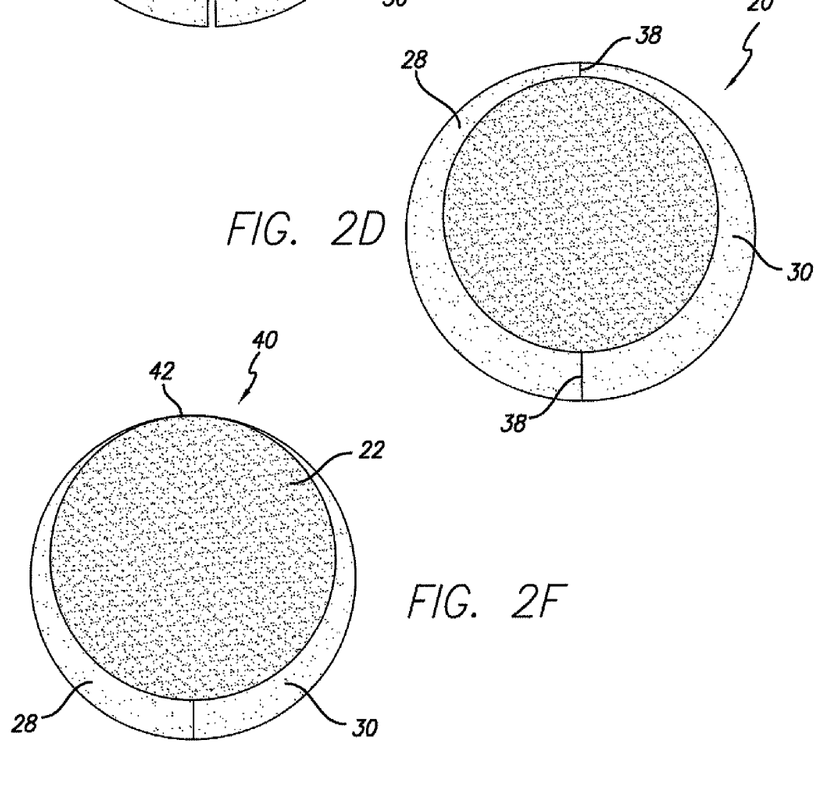

FIGS. 2B and 2C illustrate the construction 20 at a subsequent stage of formation/assembly when side support members 28 and 30 have been attached to both the body 22 and the backside support member 24 by brazing technique by using a suitable braze material 32. As best illustrated in FIG. 2C, the side support member 28 and 30 are constructed having an inside surface 34 that is configured to complement and fit circumferentially around an outside surface 36 of the body and the backside support member. In an example embodiment, where the body and backside support member are each configured having a cylindrical outside surface 36, the side support members 28 and 30 are configured as symmetrically opposed members each having a concave radiused inside surface 34 sized to provide a desired annular braze gap therebetween. FIG. 2D illustrates the construction 20 at a subsequent stage when the two side support members 28 and 30 are joined together by brazing technique using a suitable braze material 38.

Although FIG. 2B illustrates an embodiment of the construction where the side support members extend axially along an entire length of the body 22 and the backside support member 24, it is to be understood that polycrystalline ultra-hard constructions of this invention may have side support members that are configured differently than as illustrated. For example, the side support members can be configured having an axial length that covers only a partial length of the body and/or the backside support member, depending on the particular end use application. Additionally, while FIGS. 2C, 2D and 2F illustrate a construction embodiment comprising a pair of opposed side support members 24 and 30, it is to be understood that the side support member can be provided in the form of a one-piece construction, e.g., in the form of an annular member having an opening extending axially therein, wherein the opening can be coaxially oriented within the annular member or oriented having an axis that is offset with an axis of the member. Such a desired opening orientation can either be provided at the time of forming the opening, or can be formed afterwards by machining an outside surface of the support member. Accordingly, it is to be understood that configurations of side support members other than those illustrated are intended to be within the scope of this invention.

In an example embodiment the side support members are sized and shaped to both provide a desired level of improved mechanical strength to the overall construction, by increasing the attachment surface area with the body and the backside support member, and to provide an improved level of attachment strength between the construction and the end use cutting and/or wear device.

FIGS. 2E and 2F illustrate the construction 20 at a subsequent stage of formation after the side support members 28 and 30 have been attached, and after a portion of the side support members 28 and 30 have been reduced along a desired section of the construction. In an example embodiment, a portion of the side support members 28 and 30 is removed along a circumferential section 40 of the construction 20 to expose an edge 42 of the body 22 and backside support member along such section.

The portion of the side support members can be removed along the circumferential section by conventional techniques, such as by OD grinding or the like. The extent of the circumferential section 40 of the construction 20 to be exposed by removal of the side support member portions is understood to vary depending on the end use application. In an example embodiment, it is desired that the circumferential section 40 exposed by removing the side support members is sufficient in dimension to provide the construction body 22 with an exposed edge 42 ample for creating a cutting surface useful in the particular end use application, while at the same time retaining a sufficient amount of the side support members to provide a desired increase the mechanical strength of the constriction and an increase in the attachment between the construction and the end use cutting and/or wear device Alternatively, the construction 20 can be provided without having a removed section 40. In such embodiment, the construction would not be configured having a portion of the side support members 28 and 30 removed and a cutting edge 42 of the body exposed. Rather, the body 22 outside surface would be covered by the side support members as illustrated in FIG. 2D and the body cutting edge would become exposed at some point during operation of the end use device by the wearing away of the relatively less wear resistant support side members. In the embodiment illustrated in FIGS. 2A to 2F, polycrystalline ultra-hard material 22 is configured in the form of a tablet having a cylindrical outside wall surface with a defined radius, and having a thickness that extends axially from a front side surface 44 to a backside surface 46 (best shown in FIG. 2A).

It is to be understood that the radial and axial dimensions of the polycrystalline ultra-hard material body can and will vary depending on the particular tooling, cutting and/or wear application. In an example embodiment, for purposes of reference, the polycrystalline ultra-hard body can have a diameter in the range of from about 9 mm to 22 mm, although there are niche applications for body diameters of from about 6 mm and 26 mm as well. Example embodiment polycrystalline ultra-hard constructions can include polycrystalline ultra-hard bodies within the above-noted diameter ranges and having an axial thickness of from about 0.5 mm to 4.0 mm. Again, it is to be understood that these ranges are provided only for purposes of reference and example and are not intended to be limiting of polycrystalline ultra-hard constructions of this invention.

Referring to FIG. 2A, the backside support member 24 is attached to the backside surface 46 of the body 22 and has a front side surface that is preferably sized and configured to support the entire backside surface 46 of the body. The backside support member 24 comprises an outside wall section that is preferably sized and configured to match the body outside wall section. The backside support member 24 has an axial thickness or length that extends from the body to a backside surface of the construction 20. It is to be understood that the radial and axial dimensions of the backside support member can and will vary depending on the particular cutting and/or wear application.

The type of braze materials 26, 32 and 38 that are used to attach the body, backside support member, and side support members together in the construction can and will vary depending on such factors as the types of materials used to form the body 22 and/or the types of material used for to form the backside and side support members.

Braze materials useful for forming polycrystalline ultra-hard constructions of this invention include those selected from the group comprising Ag, Au, Cu, Ni, Pd, B, Cr, Si Ti, Mo, V, Fe, Al, Mn, Co, and mixtures and alloys thereof. Alloys comprising two or more of the above-identified materials are especially desired and useful for this purpose. Brazing materials useful for attaching the body and/or the support members together include those characterized as being "active" and "nonactive." "Active" braze materials are those that react with the polycrystalline ultra-hard material, and for this reason are preferably used for attaching the body to the support members, while "nonactive" braze materials are those that do not necessarily react with the polycrystalline ultra-hard material and for this reason may be useful for attaching support members together. While the above preferred uses of "active" and "nonactive" braze materials have been described, it is to be understood that this is a preferred use and that the braze materials described herein can be used to attach either or both the polycrystalline ultra-hard material and/or the support members together.

Example "active" braze materials useful for forming polycrystalline ultra-hard constructions of this invention include those having the following composition and liquidus temperature (LT) and solidus temperatures (ST), where the composition amounts are provided in the form of weight percentages:

81.25 Au, 18 Ni, 0.75 Ti, LT=960° C., ST=945° C.;
82 Au, 16 Ni, 0.75 Mo, 1.25 V LT=960° C., ST=940° C.;
20.5 Au, 66.5 Ni, 2.1 B, 5.5 Cr, 3.2 Si, 2.2 Fe, LT=971° C., ST=941° C.;
56.55 Ni, 30.5 Pd, 2.45 B, 10.5 Cr, LT=977° C., ST=941° C.;
92.75Cu, 3 Si, 2 Al, 2.25 Ti, LT=1,024° C., ST=969° C.;
82.3 Ni, 3.2 B, 7 Cr, 4.5 Si, 3 Fe, LT=1,024° C.; ST=969° C.; and
96.4 Au, 3 Ni, 0.6 Ti, LT=1,030° C., ST=1,003° C.

Example "nonactive" braze materials useful for forming polycrystalline ultra-hard constructions include those having the following composition and liquid temperature (LT) and solid temperature (ST), where the composition amounts are provided in the form of weight percentages:

52.5 Cu, 9.5 Ni, 38 Mn, LT=925° C., ST=880° C.;
31 Au, 43.5 Cu, 9.75 Ni, 9.75 Pd, 16 Mn, LT=949° C., ST=927° C.;
54 Ag, 21 Cu, 25 Pd, LT=950° C., ST=900° C.;
67.5 Cu, 9 Ni, 23.5 Mn, LT=955° C., ST=925° C.;
58.5 Cu, 10 Co, 31.5 Mn, LT=999° C., ST=896° C.;
35 Au, 31.5 Cu, 14 Ni, 10 Pd, 9.5 Mn, LT=1,004° C., ST=971° C.;
25 Su, 37 Cu, 10 Ni, 15 Pd, 13 Mn, LT=1,013° C., ST=970° C.; and
35 Au, 62 Cu, 3 Ni, LT=1,030° C., ST=1,000° C.

As noted above, braze materials useful for forming polycrystalline ultra-hard constructions can be active and react with the polycrystalline ultra-hard material. In an example embodiment, where such an active braze is used, the braze can react with the polycrystalline ultra-hard material to form a reaction product therein and/or between it and the adjacent support member. The presence of such reaction product can operate to enhance the thermal and/or mechanical properties of the polycrystalline ultra-hard material.

In an example embodiment, where the braze material includes silicon or titanium and the polycrystalline ultra-hard material comprises a polycrystalline diamond ultra-hard phase, the silicon or titanium reacts with the carbon in the diamond to form SiC or TiC. In the case where the polycrystalline ultra-hard material is TSP, the SiC or TiC reaction product has thermal expansion properties that are closer to the polycrystalline diamond phase than that of the catalyst material that was present before removal treatment. This operates to both improve thermal expansion compatibility between the TSP material and the support member. Additionally, the SiC or TiC reaction product operates to bond together adjacent diamond crystals within the TSP material, thereby operating to improve the overall mechanical strength of the TSP material within this region. It is to be understood that the extent that such region is formed within the TSP material, and the location of such region, can and will vary depending on a number of different factors such as the type of materials used to form the TSP material, the type of binder alloy that is used, the placement position of the support members, the brazing conditions, and the like.

In the event that a TSP material is used, and it comprises a reaction product between the polycrystalline diamond phase and a non-catalyst material, the braze material can be an active braze material that reacts with the polycrystalline material phase and/or with the reaction product to form a reaction product having the same desired properties as noted above.

A further advantage of using an active braze material for joining the TSP material and the support member is that such active braze material can react with oxide materials formed on the surface of the TSP material, which oxide materials are known to act as a barrier that can impair or prevent achieving a desired bond with the TSP material. Thus, the removal of such oxide materials by reaction with the braze material operates to improve the wetability of the TSP material, thereby helping to achieve a desired degree of bond strength therebetween.

In addition to the properties of being active or nonactive, braze materials used to form polycrystalline ultra-hard constructions of this invention can be selected based on their characteristic liquid (liquidus) or solid/crystallization (solidus) temperatures, as will be described in greater detail below, for the purpose of facilitating forming the polycrystalline ultra-hard constructions in a manner that intentionally reduces or eliminates the formation of voids and/or residual thermal stresses in the resulting construction. Additionally, when polycrystalline ultra-hard constructions of this invention are to be attached to an end use application device by welding or brazing technique, it is also desired that the braze material selected be one having a liquidus temperature that is higher than the welding or brazing temperature used to attach the construction. In an example embodiment, where the polycrystalline ultra-hard construction is provided in the form of a cutting element for attachment on a bit for drilling subterranean formations, it is desired that the braze material have a liquidus/solidus temperature that is above that used to join conventional cutting elements having WC—Co substrates to such drill bits.

Although FIGS. 2A, 2B and 2E illustrate the interface between the body 22 and backside support member 24 as being planar, such interface can also be nonplanar depending on such factors as the types of materials used to form the body and the support members, as well as the particular end use for the polycrystalline ultra-hard construction of this invention. Additionally, the axially directed interfacing surfaces between the body and the side support members and/or the backside support member and the side support members can be planar, i.e., have a constant diameter, or nonplanar, i.e., having a varying diameter provided by different surface features or the like, depending on the factors noted above. In situations where a greater degree of mechanical strength is desired between the attached body and support members, it may be desired that the interface therebetween be configured having nonplanar surface features to provide an increased attachment surface area. A feature of the polycrystalline ultra-hard construction 20 illustrated in FIGS. 2A to 2E is that the side support members 28 and 30 extends circumferentially around a majority of the outside surfaces of the body 22 and the backside support member 24. The interface geometry provided in this embodiment is well suited for certain cutting and/or wear applications calling for a high degree of bond strength for the polycrystalline ultra-hard material in the construction. The adjacent surfaces of the body 22 and the sidewall support members 28 and 30 are therefore configured in a manner that provides a high degree of surface area along the interface to further enhance the bond strength therebetween. Additionally, this interface configuration may provide some compressive radial residual stresses that could operate to enhance cutter performance.

Figures 3A, 3B:
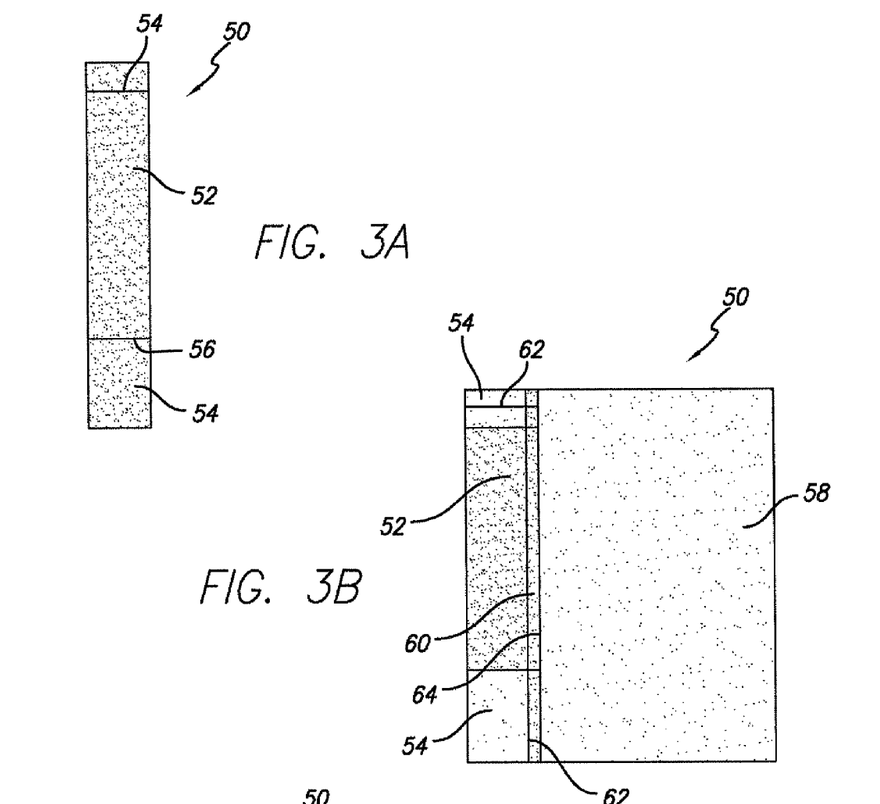
FIGS. 3A to 3C are cross-sectional side and top plan views of another example embodiment polycrystalline ultra-hard construction of this invention comprising backside and side support members, wherein the side support members are disposed around at least a portion of the polycrystalline ultra-hard material.
Figure 3C:
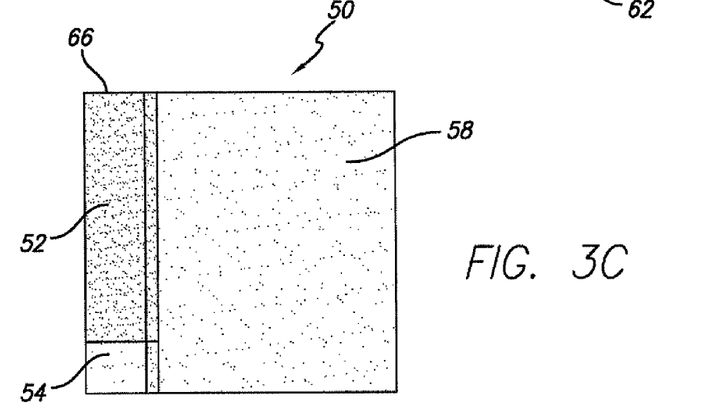

FIGS. 3A to 3C illustrate another example embodiment polycrystalline ultra-hard construction 50 of this invention during different stages of completion. FIG. 3A illustrates the construction 50 at an early stage of formation when it comprises a polycrystalline ultra-hard material 52 having side support members 54 attached thereto. As noted above for the example embodiments of FIGS. 2A, 2B and 2E, the side support member 54 can be provided in the form of a two-piece construction or can be provided in the form of a one-piece member, e.g., wherein the polycrystalline ultra-hard material 22 is disposed within an opening extending axially therethrough.

In an example embodiment, the polycrystalline ultra-hard material is provided in the form of a TSP body, and the body is attached to side support members 54 by brazing technique using a suitable braze material 56 that can be selected from the braze materials noted above. In FIG. 3A, only one side support member 54 is shown. In a preferred embodiment the construction 50 includes two side support members that surround an outside surface of the body 52 in a manner similar to that described above for the earlier construction embodiment. A front view of the construction embodiment of FIG. 3A would look the same as that illustrated in FIG.

2C, with the difference between the embodiments being that the backside support member is not yet attached.

FIG. 3B illustrates the construction 50 at a subsequent stage of formation after a backside support member 58 has been attached to both a backside surface 60 of the body 52, and backside surfaces 62 of the side support members 54. The backside support member 58 is attached to the body and side support members by brazing technique using a suitable braze material 64 that can be selected from the braze materials noted above. The construction 50 at this stage of formation has a front view that would look the same as that illustrated in FIG. 2D. Accordingly, the construction 50 of this embodiment, when contrasted with the construction of the embodiment described above and illustrated in FIGS. 2A to 2F, comprises side support members that do not surround the backside support member 58, and that only surround the body 52. The side support members 54 can be configured to surround the entire length of the body 52 or a partial length of the body 52 depending on the particular end use application.

As contrasted with the earlier construction embodiment, this construction embodiment provides a structure that avoids the presence of an internal stress concentration point that can exist at a corner location between the TSP body and the side support members and backside support members after brazing because of different thermal expansion coefficients. In this second embodiment, the backside support member extends along the entire diameter of the body, and only a relatively small region of the side support members are attached to the backside support member a distance away from the body, thereby helping to reduce or eliminate altogether the presence of the above-noted stress concentration point, which operates to reduce or eliminate the onset of cracks forming in the side support members, thereby improving the structural integrity and service life of the construction formed therefrom.

FIG. 3C illustrates the construction 50 at a final stage of formation after a desired portion of both the side support member 54 and the backside support member 58 has been removed to expose a outside edge surface 66 of the body 52. In an example embodiment, a circumferential section of the side support members 54 is removed to expose a desired section of the body to form a cutting and/or wear surface or edge. A front view of the embodiment of FIG. 3C would look the same as that illustrated in FIG. 2F.

The materials used to form the polycrystalline ultra-hard body, the support members, and the braze materials used for the construction embodiment described above and illustrated are the same as those described above.

Polycrystalline ultra-hard constructions of this invention comprise two or more support members that are specially configured to attach with the polycrystalline ultra-hard body to help improve the bond strength of the body within the construction. The support members are configured to both fit together with one another and with the polycrystalline ultra-hard body in a manner that enables movement of the support members relative to one another and relative to the body during the attachment process to avoid the formation of unwanted gaps or voids, thereby operating to minimize or eliminate the unwanted presence of residual thermal stresses within the construction, and to minimize or eliminate the presence of any unwanted stress concentrations within the construction that can occur during operation of the construction.

For example, in the polycrystalline ultra-hard construction embodiments described above and illustrated FIGS. 2A to 2F, and 3A to 3C, the polycrystalline ultra-hard body is attached to both the side support members and the backside support member. The use of the side support members in these embodiments in addition to the backside support member operates to provide an additional area of attachment with the body that operates to improve the attachment strength of the body within the construction. Further, the use of the side support members operate to minimize or eliminate the presence of unwanted stress being concentrated at the corner of the polycrystalline ultra-hard body positioned between its backside and inside wall surfaces. Conventional polycrystalline ultra-hard compact constructions, having only a backside support member, are known to suffer from internal stresses that are concentrated at or adjacent this corner.

Additionally, the use of multiple support members that are movable relative to one another and relative to the polycrystalline ultra-hard material body during the attachment process operates to minimize or eliminate the formation of unwanted residual thermal stresses in the construction that can be created during the process of attaching the body to the support members and/or attaching the support members to one another. When the attachment between the support members and/or the body is provided by a braze material during a brazing process, the braze material is known to undergo a certain degree expansion. Using multiple support members in forming constructions of this invention enables a desired degree of movement to take place amongst the body and support members during the brazing process to thereby avoid or minimize formation of unwanted thermal stresses within the construction.

The polycrystalline ultra-hard constructions described above and illustrated in FIGS. 2A to 2F, and 3A to 3C, comprise a backside support member and two or more side support members. In the illustrated embodiments, the construction comprises a two-piece side support member. The use of such two-piece side support member with a separate backside support member operates to further improve the attachment strength with the body within the construction. Additionally, the use of three or more support members operates to further improve the degree to which the support members can move relative to one another and relative to the body during the brazing process, thereby further enhancing the ability to minimize or eliminate the occurrence of unwanted residual thermal stress within the construction.

Figure 4A:
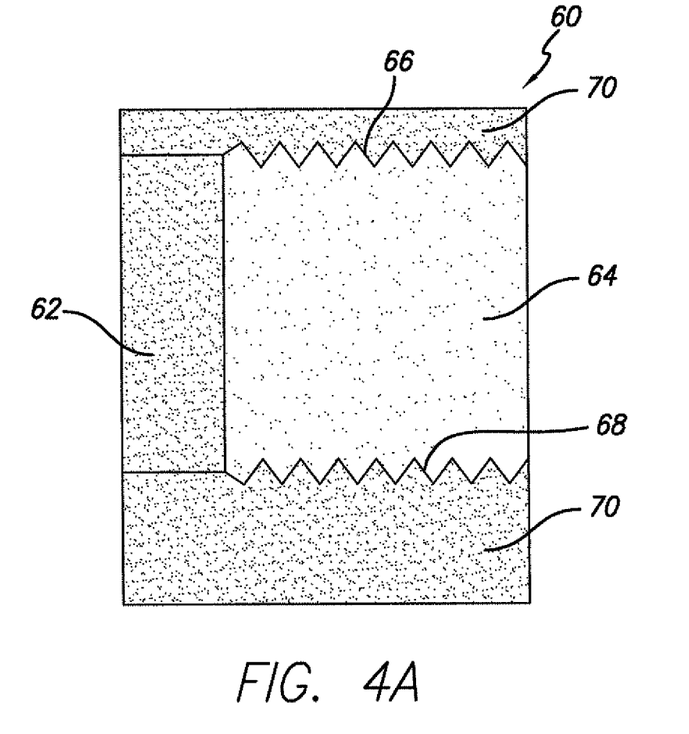
FIGS. 4A and 4B are cross-sectional side view and front plan views of other example embodiment polycrystalline ultra-hard constructions of this invention that have been engineered to provide a mechanical attachment between two or more of its members.
Figure 4B:
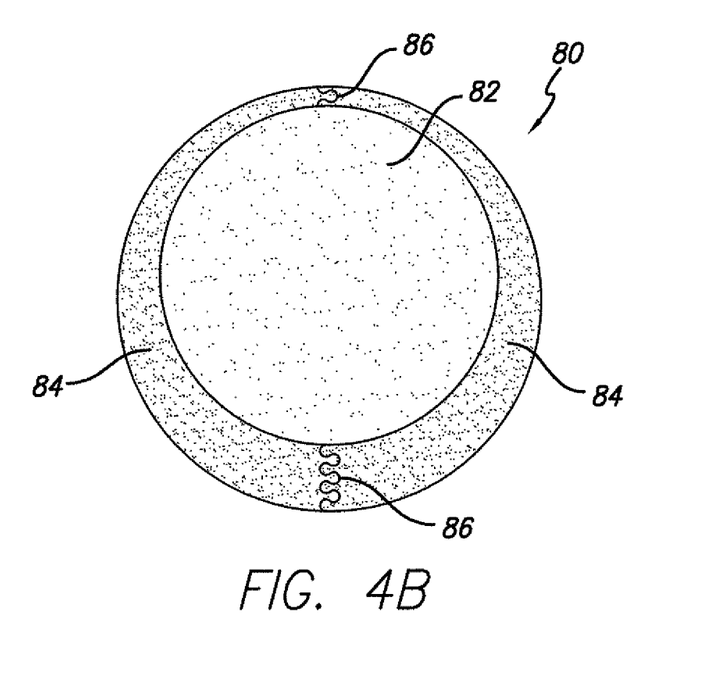

The constructions of this invention can also be configured to provide a mechanical interlocking attachment between the support members themselves and/or between the support member and the polycrystalline ultra-hard material or body. FIGS. 4A and 4B illustrate example embodiments of the construction of this invention configured to provide surface features that engage one another to provide a desired improvement in the attachment between the construction members comprising such features.

FIG. 4A illustrates a polycrystalline ultra-hard construction 60 comprising a polycrystalline ultra-hard material body 62 that is a attached to a backside support member 64, wherein the backside support member is configured having surface features 66 extending along an outside wall surface designed to engage complementary surface features 68 of one or more of the side support members 70. In this particular example, the interfacing surface features on the backside support member and the side support member are threads so that the backside support member 64 is threadably engaged with the side support member or members 70. While support members comprising surface features affording threaded engagement have been described and illustrated, it is to be understood that there are many other surface feature configurations that can be used to provide such mechanical attachment, and that such other surface feature configurations are understood to be within the scope of this invention.

FIG. 4B illustrates a polycrystalline ultra-hard construction 80 comprising a polycrystalline ultra-hard material body 82 that is a attached to a backside support member (not shown), and side support members 84 that are attached to the backside support member and one another. In this particular example, the side support members 84 comprise interfacing surfaces 86 that include one or more surface features that are designed to cooperate with one another to provide a mechanical attachment therebetween. In an example embodiment, the surface features can be configured to engage and interlock with one another when the side support members 84 are slid axially adjacent one another. For example, one of the side support members can include a male surface feature and the other side support member can include a female support member, wherein the male surface features includes a enlarged end that operates to provide interlocking attachment within the female surface feature when the opposed surface features are slidably engaged. While support members comprising surface features affording an particular interlocking engagement have been described and illustrated, it is to be understood that there are many other surface feature configurations that can be used to provide such mechanical attachment, and that such other surface feature configurations are understood to be within the scope of this invention.

Polycrystalline ultra-hard constructions of this invention can be formed using a single type of braze material to braze together the support members to on another and/or to the body. In an example embodiment, an active braze material can be used to braze the body both to the side support members and to the backside support member, as well as braze together the support members. It is to be understood that the specific type of braze material used as the single type of braze material to attach the construction can and will vary depending on such factors as the type of material used to form the polycrystalline ultra-hard body, the type of material used to form the support members, and the ultimate end use application.

Alternatively, polycrystalline ultra-hard constructions of this invention can be formed using two or more different types of braze materials to further suppress unwanted void formation and increase the strength of the resulting construction. For example, a first type of braze material can be used to join the body to one support member, while another type of braze material can be used to join the body to another support member, and/or to join the support members to one another. In such an example, it may be desirable to use an active braze material to join the body to the one or more support members, and use a nonactive braze material to join the support members together. In this example, the active braze material will react with and form a strong bond with the body, which is desired for the purpose of improving the bond strength of the body within the construction.

The different braze materials used in these constructions can be selected on the basis of the being active or nonactive and/or on the basis of the melting (liquidus) temperatures and/or solidifying (solidus) or crystallizing temperatures of the braze materials. For example, it may be desirable to use a braze material, having a relatively high melting temperature (high crystallization temperature), for joining the body to a support member, and use relatively lower melting temperature (lower crystallization temperature) braze material for joining the support members together. During the brazing process the braze material is heated to its melting temperature while the components to be brazed together are held in an assembled state. Once melted, the braze material fills the spaces between the components, after that the braze material is allowed to cool. During the cooling process, the braze material undergoes crystallization, that causes a contraction of the braze material.

In this example, selecting a higher melting temperature braze material to attach the body to a support member will cause such braze material to crystallize first during cooling while the relatively lower melting temperature braze material is still in a liquid phase. This selective choice of using different melting temperature braze materials enables the body to be attached to the support member without resistance from the other support members, which resistance to movement can cause an unwanted formation of residual thermal stress within the construction. As the assembly continues to cool, the lower melting point braze material undergoes crystallization, at a time after which the high melting point braze material has cooled and contracted, to form a desired attachment between the support members at a point when further contraction movement of the assembly will be limited.

Thus, a feature of polycrystalline ultra-hard constructions of this invention comprising multiple support members is that they permit the selective use of different types of braze materials to both provide an improved bond strength with the body, and further avoid the unwanted creation of residual thermal stresses within the construction.

Thus, it is to be understood that the polycrystalline ultra-hard constructions described herein and illustrated in the figures can be formed using a single-type of braze material, or can be form using two or more different types braze materials. In an example embodiment, referring to the construction illustrated in FIGS. 2A to 2F, a first type of braze material 26 can be used to attach the body 22 to the backside support member 24, while a second type of braze material 32 can be used to both attach the body 22 to the side support members 28 and 30, attach the side support members to the backside support member 24, and attach the side support members together. The first braze material can be an active material and the second a nonactive material, and/or the first braze material can have a relatively higher melting point than the second braze material.

In an example embodiment, referring to the construction illustrated in FIGS. 3A to 3C, a first type of braze material 56 can be used to attach the body 52 to the side support members 54 and to attach the side support members together, while a second type of braze material 64 can be used both to attach the body 52 to the backside support member 58 and to attach the side support members to the backside support member. The first braze material can have a relatively higher melting point than the second braze material. In a preferred embodiment, both the first and second braze materials are active.

As noted above, it is to be understood polycrystalline ultra-hard constructions can be formed using a variety of different types of braze materials to attachments between a number of different adjacent body and support member surfaces, and that all such available variations formed by using such different types of braze materials are within the scope of this invention.

The side and backside support members used for forming constructions of this invention can be formed from materials capable of providing a desired level of structural strength and rigidity to the construction to thereby enable attachment and use of the construction with a desired cutting and/or wear device. It is also desired that the support members used to form constructions of this invention be made from materials having properties that facilitate attachment to one another and to the body material by brazing process or the like. Further, it is desired that the materials used to form the support members enable the construction to be attached to the end use cutting and/or wear device by conventional method, e.g., by brazing or welding or the like. Suitable materials useful for making support members include, and are not limited to, carbides, nitrides, carbonitrides, ceramic materials, metallic materials, ultra-hard materials such as those including diamond and/or cubic boron nitride components, cermet materials, and mixtures, combinations, and alloys thereof. Materials useful for forming the support members can be selected from the same general types of materials used to form substrates for conventional PCD materials, or used to form substrates for conventional thermally stable polycrystalline diamond compact constructions, including cermet materials such as cemented tungsten carbide.

In addition to having the ability to use different types of brazing materials when forming constructions of this invention, such constructions can also be formed by using support members that are made from the same or different types of materials. For example, constructions of this invention can be formed using support members that are all formed from the same material, or having one or more support member formed from a material that is different from that of another support member in the same construction. The ability to use support members formed from different types of materials provides a further variant that can be adjusted for providing constructions having improved bond strength and reduced residual thermal stress.

For example, it may be desirable to form the backside support member from a material having a thermal expansion characteristic and/or elastic moduli that more closely matches that of the body material to minimize the formation of thermal expansion stresses during brazing and during operation. It may also be desired in certain applications to form the side support members from a material that will facilitate attachment with the end use cutting and/or wear device. In an example embodiment, it may be desirable that the backside support member be formed from a material such as cemented tungsten carbide having a low cobalt content, to achieve a good match in thermal expansion coefficients and elastic moduli with the body, and the side support member be formed from a material such as cemented tungsten carbide having a higher cobalt content to ensure high strength and fracture toughness, and to also facilitate attachment of the construction by brazing with the end use cutting and/or wear device.

When using the term "different" in reference to materials used to form both the braze material and the support members, it is to be understood that this includes materials that generally include the same constituents, but may include different proportions of the constituents and/or that may include differently sized constituents, wherein one or both such features operate to provide a different mechanical and/or thermal property in the material.

Polycrystalline ultra-hard constructions of this invention are specially engineered to include multiple support members, that can be configured differently, that can be made from the same or different material, and that can be attached to one another and to the polycrystalline ultra-hard body using the same or a different braze material. The polycrystalline ultra-hard body as used with these constructions can be formed from any of the materials described above. Constructions configured in this manner enable a designer to vary one or more of these features for the purpose of achieving a desired improvement in bond strength, and/or a desired reduction in residual thermal stress, and/or a desired reduction in stress concentrations within the construction to meet the needs of different end use applications. Further, polycrystalline ultra-hard constructions of this invention comprising such multiple support members enable such constructions to be attached by conventional methods, such as by brazing, welding or the like, to a variety of different end use application devices.

Polycrystalline ultra-hard constructions of this invention can be used in a number of different applications, such as tools for mining, cutting, machining, milling and construction applications, wherein properties of thermal stability, and/or wear and abrasion resistance, mechanical strength, reduced thermal residual stress, and reduced stress concentrations are highly desired. Polycrystalline ultra-hard constructions of this invention are particularly well suited for forming working, wear and/or cutting elements in machine tools and drill and mining bits such as roller cone rock bits, percussion or hammer bits, diamond bits, and shear cutters used in subterranean drilling applications.

Figure 5:
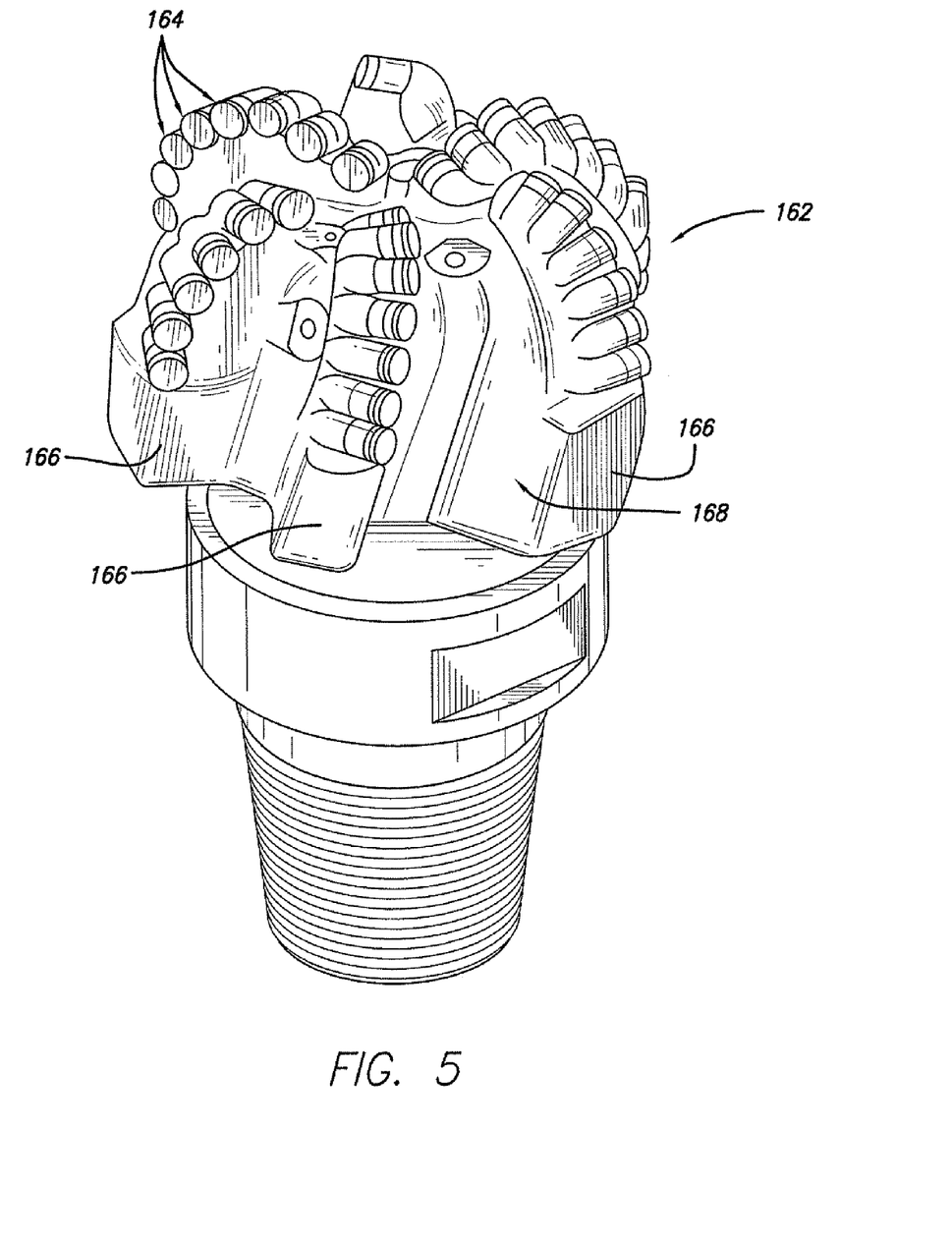
FIG. 5 is a perspective side view of a drag bit comprising a number of polycrystalline ultra-hard constructions of this invention provided in the form of shear cutters.

FIG. 5 illustrates a drag bit 162 comprising a plurality of cutting elements made from polycrystalline ultra-hard constructions of this invention configured in the form of shear cutters 164. The shear cutters 164 are each attached to blades 166 that extend from a head 168 of the drag bit for cutting against the subterranean formation being drilled. The shear cutters 164 are attached by conventional welding or brazing technique to the blades and are positioned to provide a desired cutting surface.

Figure 6:
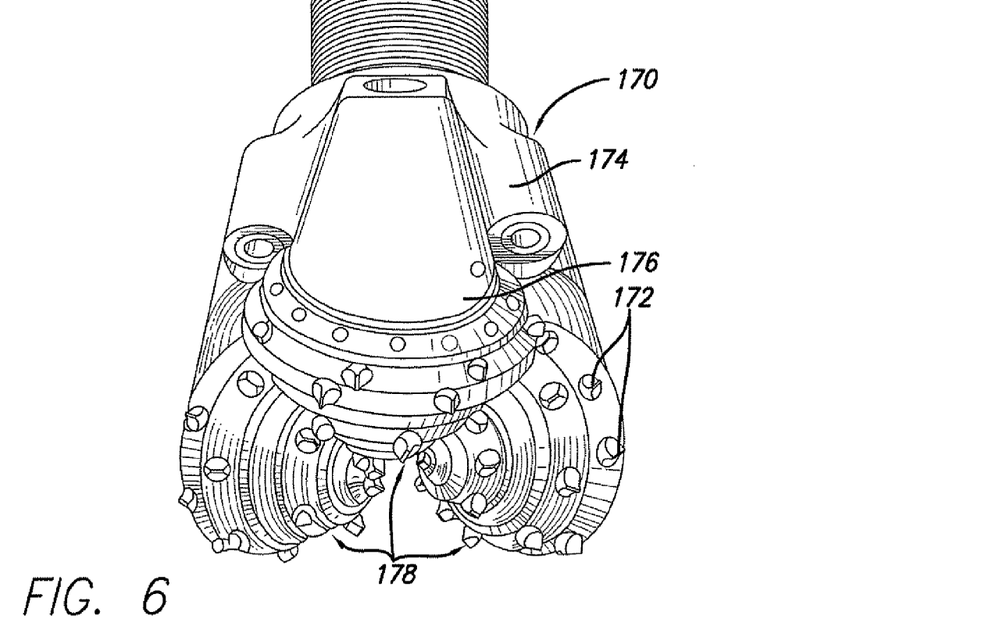
FIG. 6 is a perspective side view of a rotary cone drill bit comprising a number of polycrystalline ultra-hard constructions of this invention provided in the form of inserts.

FIG. 6 illustrates a rotary or roller cone drill bit in the form of a rock bit 170 comprising a number of polycrystalline ultra-hard constructions of this invention provided in the form of wear or cutting inserts 172. The rock bit 170 comprises a body 174 having three legs 176, and a roller cutter cone 178 mounted on a lower end of each leg. The inserts 172 can be formed according to the methods described above. The inserts 172 are provided in the surfaces of each cutter cone 178 for bearing on a rock formation being drilled.

Figure 7:
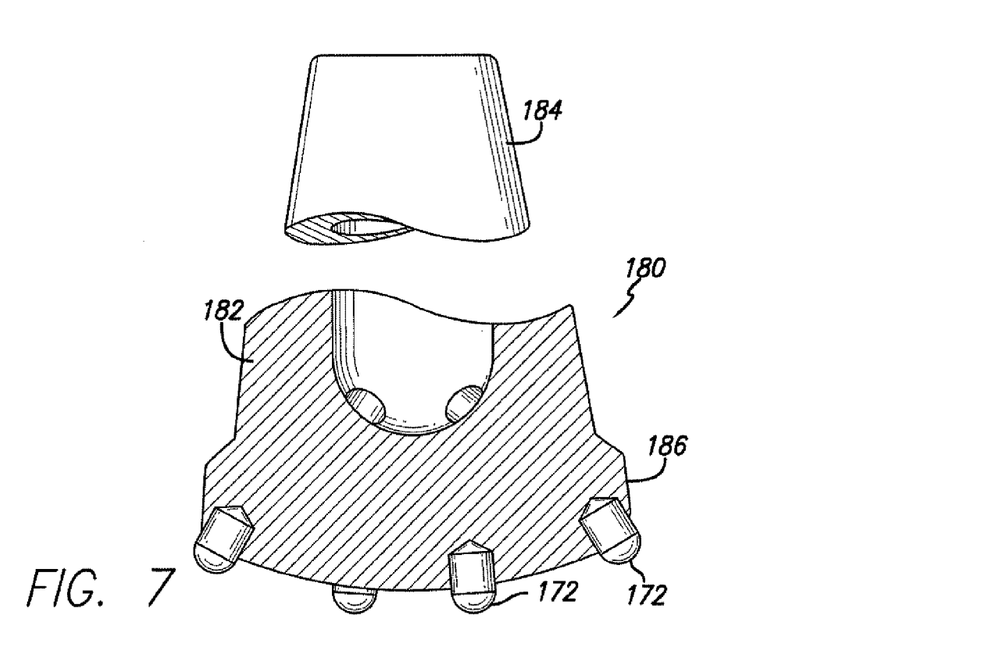
FIG. 7 is a perspective side view of a percussion or hammer bit comprising a number of polycrystalline ultra-hard constructions of this invention provided in the form of inserts.

FIG. 7 illustrates the inserts described above as used with a percussion or hammer bit 180. The hammer bit comprises a hollow steel body 182 having a threaded pin 184 on an end of the body for assembling the bit onto a drill string (not shown) for drilling oil wells and the like. A plurality of the inserts 172 are provided in the surface of a head 186 of the body 182 for bearing on the subterranean formation being drilled.

Other modifications and variations of polycrystalline ultra-hard constructions comprising a polycrystalline ultra-hard body attached to one or more support members formed from the materials and attached together in the manner described above will be apparent to those skilled in the art. It is, therefore, to be understood that within the scope of the appended claims, this invention may be practiced otherwise than as specifically described.

What is claimed is:
1. A polycrystalline ultra-hard construction for mounting on a tool body comprising:
   a polycrystalline ultra-hard material body having a first phase of bonded together diamond crystals, and having a plurality of second phases disposed within the first phase, wherein second phases are selected from the group consisting of empty voids, a reaction product with the polycrystalline diamond, a catalyst material used to form the first phase, and combinations thereof; multiple support members attached to the polycrystalline ultra-hard material body, wherein the multiple support members comprise:
- a backside support member that is attached to the polycrystalline ultra-hard material body along a backside surface of the polycrystalline ultra-hard material body by a first braze material; and
- a side support member extending circumferentially along a side surface of the backside support member and a side surface of the polycrystalline ultra-hard material body and extending along an axial length of the polycrystalline ultra-hard material body, wherein the side support member is attached to the backside support member and to the polycrystalline ultra-hard material body by a second braze material, said ultra-hard construction being attachable to said tool body.

2. The construction as recited in claim 1 wherein the side support member is a two-piece construction.

3. The construction as recited in claim 2, wherein each piece of said two-piece construction is individually attached to the body side surface of the polycrystalline ultra-hard material body.

4. The construction as recited in claim 2, wherein each piece of said two-piece construction is attached to the backside support.

5. The construction as recited in claim 2, wherein each piece of said two-piece construction is attached to the polycrystalline ultra-hard material body surface.

6. The construction as recited in claim 1 wherein an interface of at least one of the multiple support members is nonplanar.

7. The construction as recited in claim 1 wherein at least one of the multiple support members has a nonplanar surface that interfaces with another support member or the polycrystalline ultra-hard material body.

8. The construction as recited in claim 1 wherein one of the support members includes an interface surface that engages a complementary interface surface of another support member or the polycrystalline ultra-hard material body.

9. The construction as recited in claim 8 wherein the complementary interface surfaces form an interlocking attachment therebetween.

10. The construction as recited in claim 1 wherein one of the first and second braze materials forms a reaction product with the polycrystalline ultra-hard material body.

11. The construction as recited in claim 1 wherein the first braze has a melting temperature that is higher than that of the second braze.

12. The construction as recited in claim 1 wherein one of the multiple support members is formed from a material different from another of the multiple support members.

13. The construction as recited in claim 1, wherein the polycrystalline ultra-hard material body surface comprises a front side surface opposite the backside surface, and wherein a side surface of the polycrystalline ultra-hard material body extends between the front side surface and backside surface of the polycrystalline ultra-hard material body.

14. The construction as recited in claim 1, wherein the side support member covers the entire circumference of the polycrystalline ultra-hard material body.

15. The construction as recited in claim 1, wherein the side support member covers the entire circumference of the backside support member.

16. The construction as recited in claim 1, wherein the side support member covers an entire axial length of the polycrystalline ultra-hard material body.

17. The construction as recited in claim 1, wherein the side support member covers an entire axial length of the backside support member.

18. The construction as recited in claim 1, wherein the polycrystalline ultra-hard construction has a cylindrical outer surface for mounting on the tool body, wherein the tool body is a bit.

19. The construction as recited in claim 18, wherein the construction is a shear cutter.

20. The construction as recited in claim 1, wherein said side support member comprises a cylindrical outer surface, said cylindrical outer surface surrounding at least a portion of said polycrystalline ultra-hard material body and at least a portion of the backside support member.

21. The construction as recited in claim 20, wherein said polycrystalline ultra-hard material body and said backside support member have cylindrical outer surfaces.

22. The construction as recited in claim 20 wherein the side support member has a wall thickness that varies as a function of radial position.

23. The construction as recited in claim 1, wherein the side support member only extends along the side surface of the body side support member and the side surface of the polycrystalline ultra-hard material body.

* * * * *